(12) United States Patent
Ban et al.

(10) Patent No.: US 10,530,029 B2
(45) Date of Patent: Jan. 7, 2020

(54) METHOD FOR DESIGNING AND MANUFACTURING CIRCULATOR MODULE HAVING FUNCTION OF DIRECTIONAL COUPLER EMBEDDED THEREIN

(71) Applicant: 3RWAVE CO., LTD., Gyeonggi-do (KR)

(72) Inventors: Yong Ju Ban, Pierrefonds (CA); Dong Hui Lee, Gyeonggi-do (KR); Mi Yeon Kim, Seoul (KR)

(73) Assignee: 3RWAVE CO., LTD., Gyeonggi-Do (KR)

( * ) Notice: Subject to any disclaimer, the term of this patent is extended or adjusted under 35 U.S.C. 154(b) by 80 days.

(21) Appl. No.: 15/576,457

(22) PCT Filed: Apr. 20, 2016

(86) PCT No.: PCT/KR2016/004110
§ 371 (c)(1),
(2) Date: Nov. 22, 2017

(87) PCT Pub. No.: WO2017/052019
PCT Pub. Date: Mar. 30, 2017

(65) Prior Publication Data
US 2018/0159192 A1    Jun. 7, 2018

(30) Foreign Application Priority Data

Sep. 24, 2015  (KR) .................. 10-2015-0135442

(51) Int. Cl.
*H01P 1/387* (2006.01)
*H01P 1/38* (2006.01)
*H01P 3/08* (2006.01)
*H01P 5/18* (2006.01)
*H01P 11/00* (2006.01)
*H05K 1/02* (2006.01)

(52) U.S. Cl.
CPC ................ *H01P 1/38* (2013.01); *H01P 1/387* (2013.01); *H01P 3/08* (2013.01); *H01P 5/18* (2013.01); *H01P 11/00* (2013.01); *H01P 11/003* (2013.01); *H05K 1/0237* (2013.01)

(58) Field of Classification Search
CPC .. H01P 1/38; H01P 1/383; H01P 1/387; H01P 1/32
USPC .................................................. 333/1.1, 24.2
See application file for complete search history.

(56) References Cited

FOREIGN PATENT DOCUMENTS

| JP | 02-241102 | 9/1990 |
|---|---|---|
| JP | 2002-064309 | 2/2002 |
| JP | 2002-185216 | 6/2002 |
| KR | 101057736 | 8/2011 |
| KR | 1020110101621 | 9/2011 |

*Primary Examiner* — Stephen E. Jones
(74) *Attorney, Agent, or Firm* — IPLA P.A.; James E. Bame

(57) ABSTRACT

A modularization of a circulator and a directional coupler used in a wireless communication system comprises: a circulator; and a signal coupler, where the signal coupler does not have directivity by itself, and directivity of the circulator module is controlled by isolation characteristics of the circulator to improve electrical characteristics of a wireless communication system and miniaturize the wireless communication system by applying the electrical characteristics in common with a circulator to modularize the wireless communication system without implementation of a circuit of a directional coupler capable of sampling high-frequency signals.

6 Claims, 7 Drawing Sheets

METHOD FOR DESIGNING AND MANUFACTURING CIRCULATOR MODULE HAVING FUNCTION OF DIRECTIONAL COUPLER EMBEDDED THEREIN

BACKGROUND

The present invention relates to a method for designing and manufacturing a circulator module having a function of a directional coupler embedded therein.

Generally, a non-reciprocal circuit element such as a circulator and an isolator is a high-frequency communication part designed to allow a signal inputted through a predetermined port to be rotated in one direction in accordance with Faraday rotation so as to be transmitted to another port.

As shown in FIG. 1, in the case of the circulator, usually, three ports are provided and the signals having the same transfer coefficient and reflection coefficient are usually designed to be transmitted to other adjacent ports. Therefore, each port can be an input port and an output port for an adjacent port.

Generally, a circulator is located between a power amplifier and an antenna at a transmitting end of a wireless communication apparatus, so that a signal amplified from a power amplifier is transmitted to an antenna with a small loss. On the other hand, it serves to shield any signal so as to prevent a signal reflected from the antenna or unwanted signal from being transmitted to the power amplifier.

A directional coupler is a passive reciprocal network with four ports. It can sample one of the input signals for an input port while the other port has an electrical isolation property for the corresponding input signal. In order to ideally operate the directional coupler, all four ports should be matched and typically include a transmission line of a quarter wavelength. The directional coupler is used to sample a signal flowed in a certain direction.

FIG. 2 is a diagram illustrating a symbol of a general directional coupler.

As shown in FIG. 2, in the ideal directional coupler, the signal input to a port 1 (P1) is mostly transmitted to a port 2 (P2) and very small signal thereof is coupled at a port 3 (P3). However, it is not transmitted to a port 4 (P4). On the contrary, a signal input to the port 2 (P2) is sampled at the port 4 (P4). However, it is not transmitted to the port 3 (P3). That is, the directional coupler is an element designed to allow a signal flowed in a specific direction to be coupled only to a specific port.

FIG. 3 is a diagram illustrating a sampling signal transmission direction according to an input direction of a signal in a directional coupler.

As shown in FIG. 3, the directional coupler is generally constituted by connecting a termination resistor to one port. The signal input from a port 1 (P1) can be sampled at a port 3 (P3), while the coupling signal of the signal input to a port 2 (P2) is transmitted to a port to, which the termination resistor is connected, to be destroyed.

In the directional coupler, the amount of attenuation of the output signal (P2) with respect to the input signal (P1) is referred to as an insertion loss, the degree of insulation of the input signal (P1) at the port 4 (P4) is referred to as an isolation, the degree of coupling at the port 3 (P3) with respect to the input signal (P1) is referred to as coupling, and a value obtained by subtracting the coupling from the isolation is referred to as a directivity. Here, the directivity is a yardstick for evaluating how well the input signal from the port 1 (P1) is transmitted to the port 3 (P3) against the port 4 (P4) and is one of the most important evaluation items of the directional coupler.

The formula for this is as follows.

[Equation]

Insertion Loss$(IL)=10*\log(P1/P2)$

Isolation$(I)=10*\log(P1/P4)$

Coupling$(C)=10*\log(P1/P3)$

Directivity$(D)=10*\log(P3/P4)$

Generally, directional coupler is located between power amplifier and antenna like a circulator and is used for sampling the magnitude of signal amplified from the power amplifier. As mentioned above, the directivity of the coupler is an important electrical characteristic because only the input signal amplified from the power amplifier should be sampled.

Since the demand for communication equipment increases and the price competition is fierce owing to the increase of the wireless communication demand and the development of the communication technology, the modularization of the used components is continuously required so as to reduce the insertion loss of the system, which is especially the electric characteristic of the communication equipment.

Accordingly, the researches on the modularization of the directional coupler and the circulator have been carried out. However, since each device is not only completely different in its electrical operation but also structurally made of completely different materials, there are many difficulties in modularization.

FIG. 4 is a circuit diagram in which the directional coupler and the circulator are modularized. The modules of the circulator and directional coupler implemented mostly in the prior art follow the configuration of the module shown in FIG. 4.

In some prior arts, the module is designed in such a manner that the directional coupler is implemented in a laminated substrate and the circulator is mounted on the laminated substrate. Such a module may cause the following problems. That is, since the heat generated in the circulator is transmitted to the bottom surface of the module through the laminated substrate, efficient heat transfer is difficult. Where the heat cannot be efficiently transferred, since the temperature of the circulator and the directional coupler in the laminated substrate is increased, the electrical characteristics of the module can be deteriorated. Also, the directional coupler and the circulator used in the base station and the repeater should withstand a high output signal. However, in case of the laminated substrate having the directional coupler, since a high frequency signal of high output is transmitted by a plurality of via holes, it cannot bear the high output signal. As a result, it is difficult to expect the ultimate improvement of the insertion loss through the module circuit, in that only the individual elements are collected in one place. In addition, in some prior arts mentioned above, the manufacturing cost is increased because it is manufactured by using an expensive substrate based on multilayered Teflon or an expensive LTCC substrate.

SUMMARY OF THE INVENTION

The present invention is, in modularizing a directional coupler and a circulator, to simplify a structure of the module by applying electrical characteristics shared with each other, to improve the electrical characteristics, and to reduce the size thereof.

According to one aspect of the present invention so as to accomplish these objects, there is provided to a circulator module including: a circulator; and a signal coupler, wherein the signal coupler does not have directivity by itself, and directivity of the circulator module is controlled by isolation characteristics of the circulator.

At this time, the signal coupler includes a coupling line and a main transmission line, and the coupling line crosses vertically to the main transmission line at a predetermined interval.

At this time, the coupling line and the main transmission line are formed on layers of a printed circuit board different from each other.

At this time, the printed circuit board includes a ground plane provided between the main transmission line and the coupling line, the ground plane is provided with an open slot, and a degree of electrical coupling between the main transmission line and the coupling line is controlled by the open slot.

At this time, a part of the coupling line and the main transmission line are positioned on the same layer of a printed circuit board, the other part of the coupling line is a coupling conductor having a jump line form above the main transmission line in the crossing area, and electrical coupling is generated between the main transmission line and the coupling line through the coupling conductor.

According to another aspect of the present invention so as to accomplish these objects, there is provided to a circulator module including: a circulator; and a signal coupler, wherein the signal coupler includes a main transmission line on which a signal passing through an input port and an output port of the circulator flows, and a coupling line for performing a function of sampling the signal flowing through the main transmission line, a signal flowing through the coupling line is provided through a port distinguished from the input port and the output port, the signal coupler does not have directivity by itself, and directivity of the signal coupler is controlled by isolation characteristics of the circulator.

At this time, the coupling line and the main transmission line are isolated from each other at a predetermined interval, and cross each other vertically.

At this time, the coupling line and the main transmission line are formed on layers of a printed circuit board different from each other.

At this time, the printed circuit board includes a ground plane provided between the main transmission line and the coupling line, the ground plane is provided with an open slot, and a degree of electrical coupling between the main transmission line and the coupling line is controlled by the open slot.

At this time, a part of the coupling line and the main transmission line are positioned on the same layer of a printed circuit board, the other part of the coupling line is a coupling conductor having a jump line form above the main transmission line in the crossing area, and electrical coupling is generated between the main transmission line and the coupling line through the coupling conductor.

In the modularization of the circulator and the directional coupler according to the present invention, since the transmission line having a length of ¼ wavelength ($\lambda/4$) for constituting the directional coupler is eliminated, the insertion loss of the module can be remarkably reduced and the size of the module can be reduced. Further, since a high-output signal does not flow through the via-hole etc., the reliability of the product is improved and the handling on the high-frequency signal of high-output is possible.

BRIEF DESCRIPTION OF DRAWINGS

The above and other objects, features and advantages of the present invention will be more apparent from the following detailed description taken in conjunction with the accompanying drawings, in which.

DETAILED DESCRIPTION OF THE INVENTION

Hereinafter, embodiments of the present invention will be described with reference to the accompanying drawings. However, the present invention is not limited to the embodiments described in the description, and may be embodied in various forms. The terms used in the description are to help understanding of the embodiments, and are not intended to limit the scope of the present invention. In addition, singular forms used hereinafter may include plural forms unless phrases do not show the meaning which is obviously opposite thereto.

Figure 1:
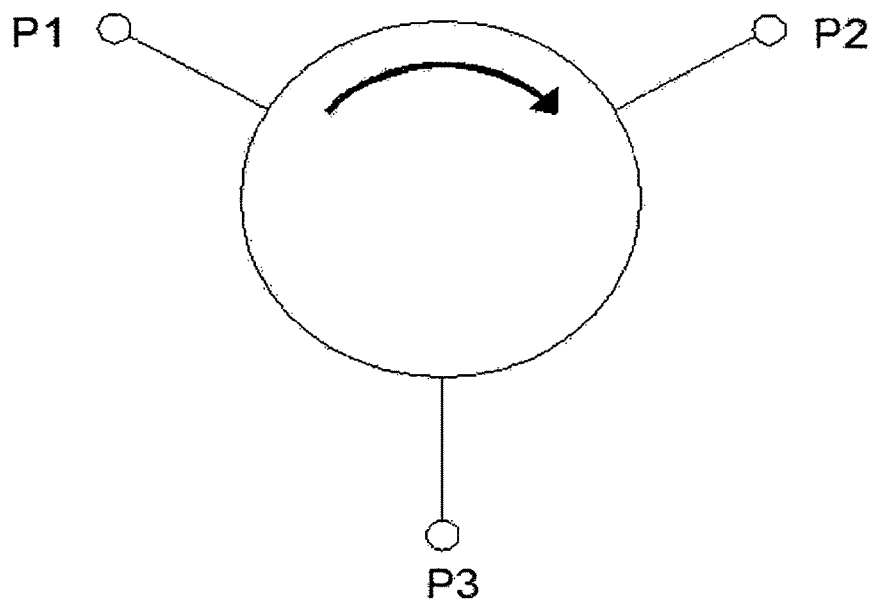
FIG. 1 is a diagram illustrating a general circulator symbol.
Figure 2:
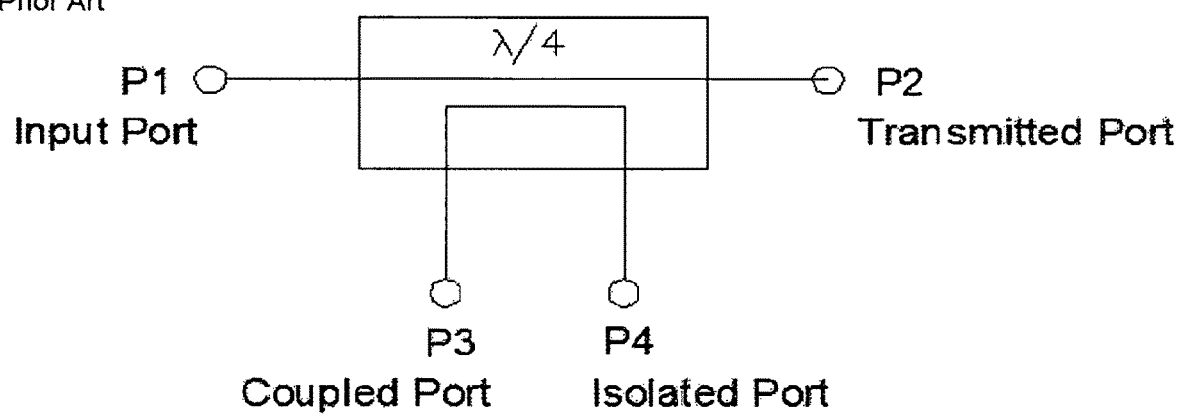
FIG. 2 is a diagram illustrating a general directional coupler symbol.
Figure 3:
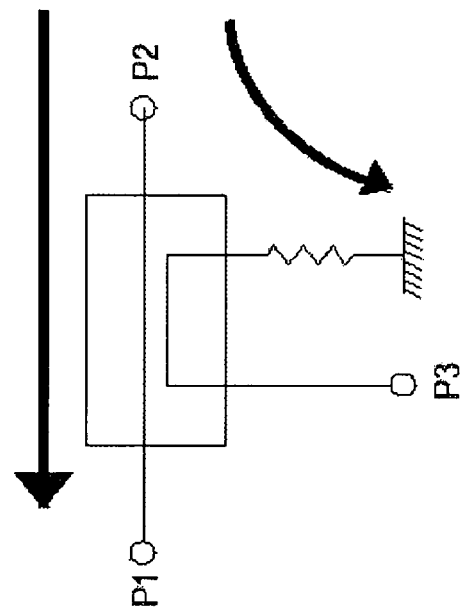
FIG. 3 is a diagram illustrating a sampling signal transmission direction depending on an input direction in a directional coupler.
Figure 3:
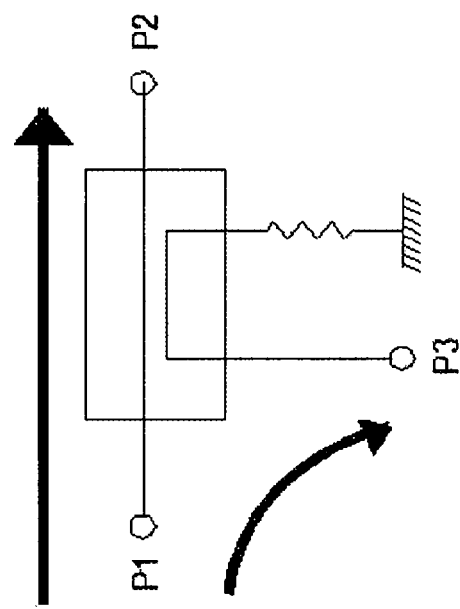
Figure 4:
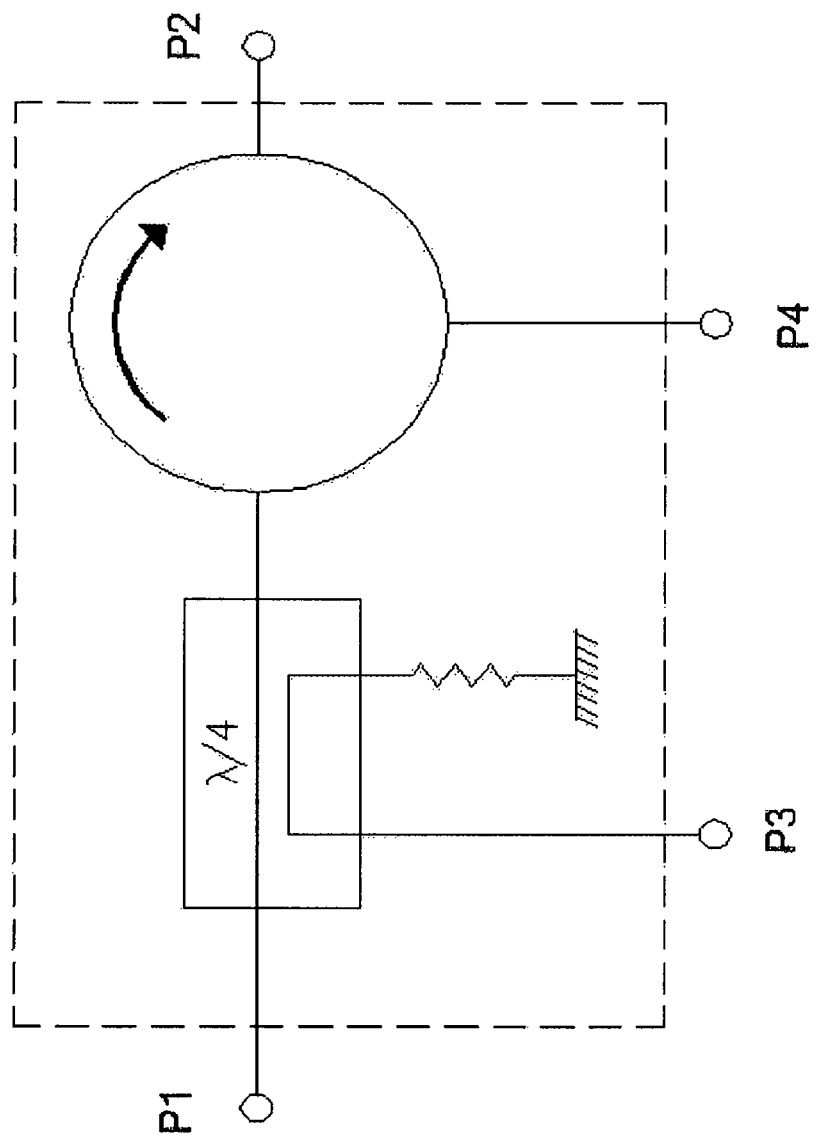
FIG. 4 is a circuit diagram illustrating a circulator and a directional coupler modularized according to the related art.
Figure 5:
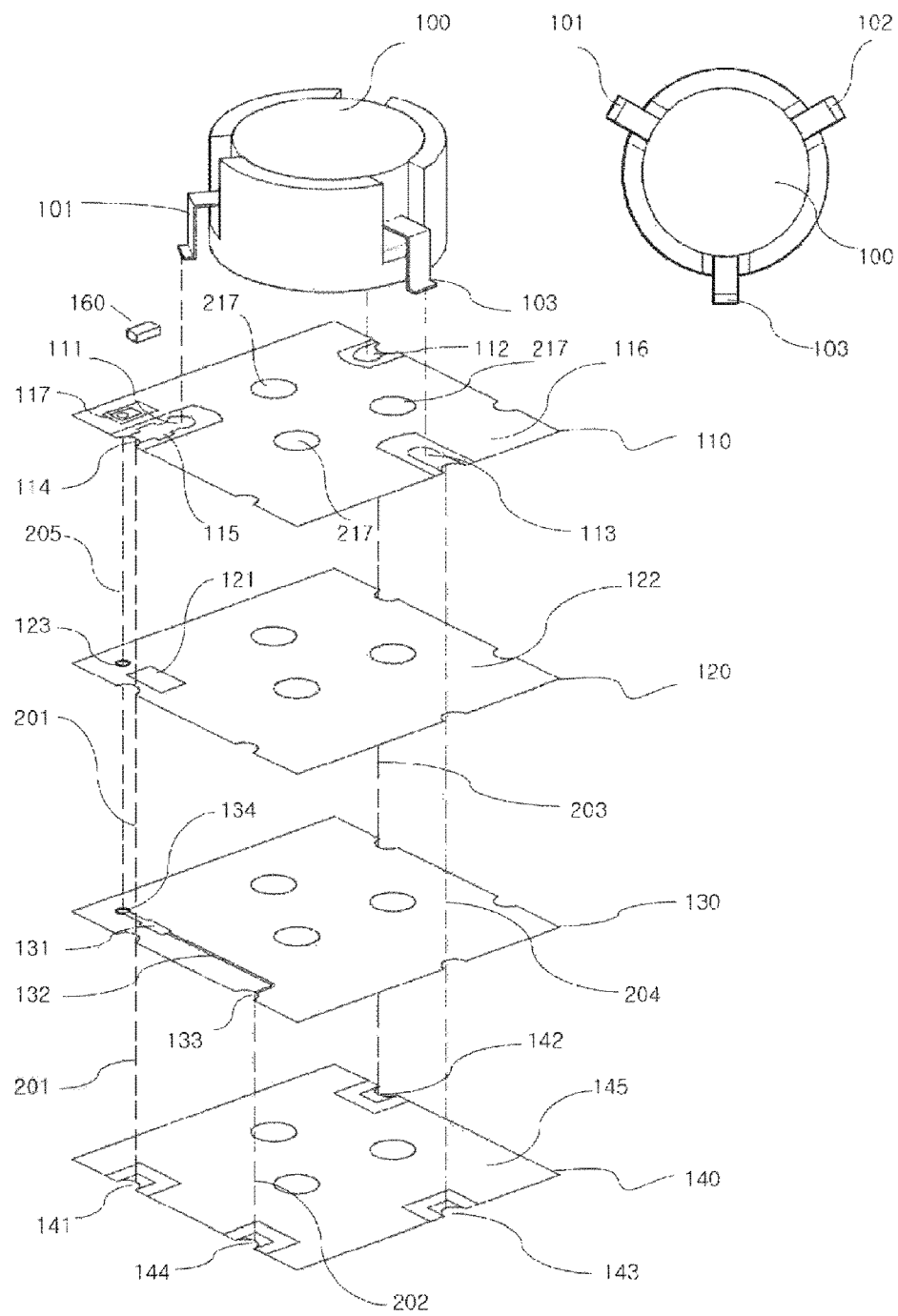
FIG. 5 is a diagram illustrating a circulator module designed according to an embodiment of the present invention.

FIG. 5 is a lamination diagram illustrating a circulator module designed according to an embodiment of the present invention.

As illustrated in FIG. 5, a circulator module according to an embodiment of the present invention may include a circulator (100) and four printed circuit boards (110, 120, 130, and 140) laminated sequentially from top to bottom.

Connection terminals (101, 102, and 103) of a center conductor stretched out of an open face of the circulator (100) made of a soft magnetic material are connected to input/output connection conductor terminals (111, 112, and 113) formed on the top layer (110) of the printed circuit board, respectively.

The input/output connection conductor terminals (111, 112, and 113) to be provided with input/output terminals (101, 102, and 103) of the circulator (100) are formed on the top layer (110) of the printed circuit board, and a ground plane of the circulator may be provided on a ground plane (116) of the top layer (110) by using alignment holes (217). In addition, a termination resistor (160) may be connected to a conductor terminal portion (117) connected to the third layer (130) from the top through internal connection (205).

An open face (121), which is an electrical coupling passage between a main transmission line (115) formed on the top layer (110) and a coupling conductor portion (131) of a coupling line (132) formed on the third layer (130), is formed on the second layer (120) from the top. It is possible to adjust the degree of coupling between the main transmission line (115) and the coupling line (132) by adjusting the size of the open face (121). In addition, a conductor portion (123), from which a ground plane for connecting a via-hole from the third layer (130) to the top layer (110) is removed, is formed on the second layer (120).

In embodiments of the present invention, a portion including the main transmission line (115) and the coupling line (132) may be referred to as 'signal coupler'. The signal coupler does not have directivity by itself. In the embodiment illustrated in FIG. 5, the signal coupler may include the open face (121).

The coupling line (132) is formed on the third layer (130) from the top, and the coupling line (132) is provided with the coupling conductor portion (131) and a side connection terminal (133). In addition, a conductor portion (134) for connecting a via-hole is formed at one end of the coupling conductor portion (131).

The bottom layer (140) is provided with input/output terminals (141, 142, and 143), and a coupling terminal (144) of the module.

The circulator module illustrated in FIG. 5 is operated electrically as follows.

A high-frequency signal input through the first input/output terminal (141) provided on the bottom layer (140) of the module is input to a connection terminal (114) of the top layer (110) through side connection (201), which is a portion connected along the side of the printed circuit board. A very small part of the input high-frequency signal is coupled with the coupling conductor portion (131) of the coupling line (132) crossing with the main transmission line (115), and the coupled high-frequency signal is connected and output to the coupling terminal (144) through side connection (202). Meanwhile, most high-frequency signals are transmitted to the connection conductor portion (111), and are transmitted to the input/output connection terminal (101) of the circulator. The high-frequency signal input to the circulator is rotated clockwise by Faraday rotation phenomenon and is transmitted to the output connection terminal (102). The transmitted high-frequency signal is transmitted to the connection conductor portion (112), passes through side connection (203), and is output through the second input/output terminal (142) formed on the bottom layer (140).

Meanwhile, the high-frequency signal input through the second input/output terminal (142) is also rotated clockwise by Faraday rotation phenomenon of the circulator, and is transmitted to the third input/output terminal (143), and the high-frequency signal is not transmitted to the first input/output terminal (141) and the coupling terminal (144).

Figure 6:
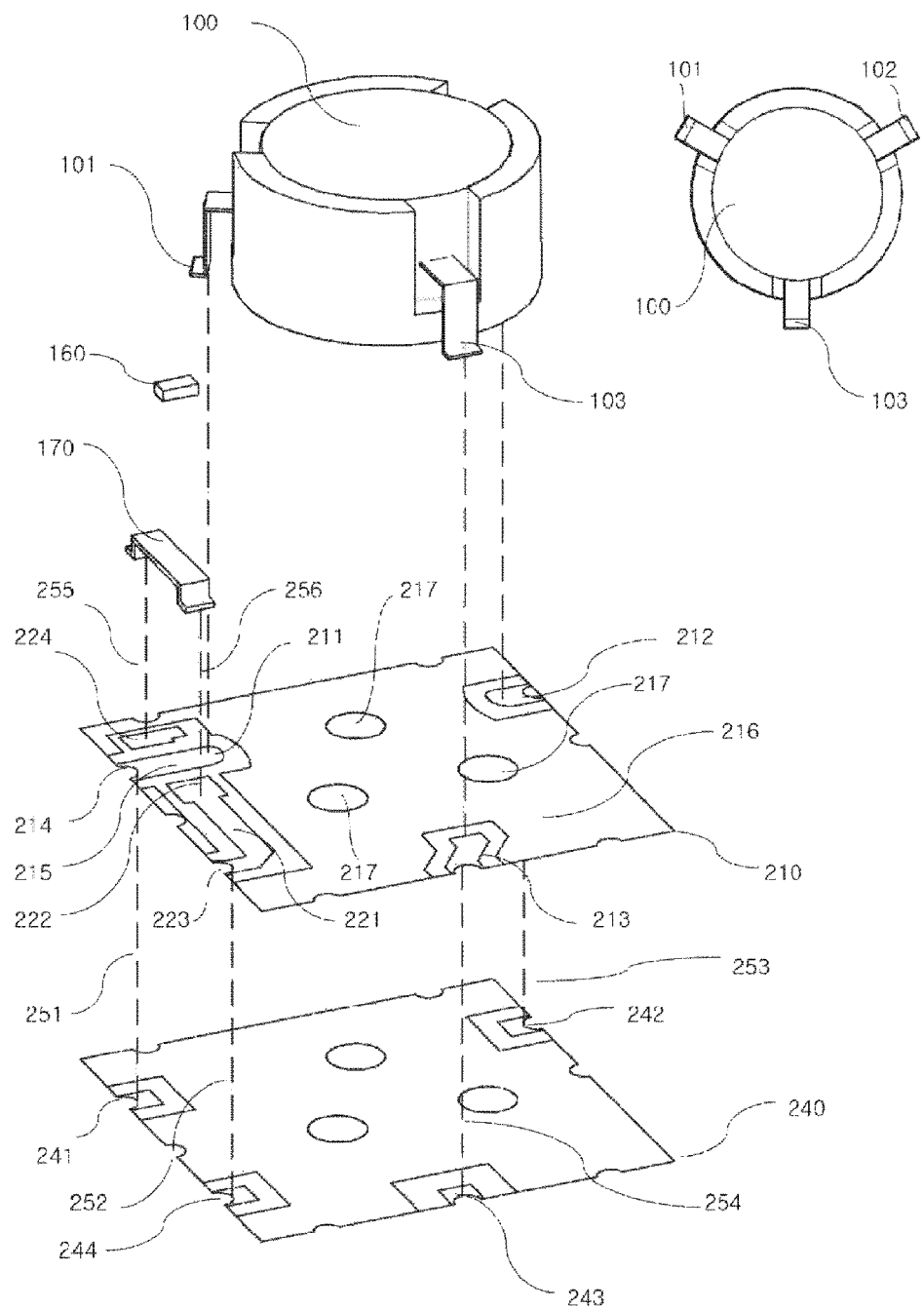
FIG. 6 is a diagram illustrating a circulator module designed according to another embodiment of the present invention.

FIG. 6 is a diagram illustrating a circulator module according to another embodiment.

As illustrated in FIG. 6, connection terminals (101, 102, and 103) of a center conductor stretched out of an open face of the circulator (100) are electrically connected to input/output connection conductor portions (211, 212, and 213) formed on an upper layer (210) of a printed circuit board, respectively.

The terminals (211, 212, and 213) to be provided with input/output terminals (101, 102, and 103) of the circulator (100) are formed on the upper layer (210) of the printed circuit board, and a ground plane of the circulator is aligned with alignment holes (217) formed on a ground plane (216) of the upper layer. In addition, a coupling line (221) for electrical coupling with the main transmission line (215) is formed, and terminals (222 and 224) to be provided with a coupling conductor (170) for allowing the main transmission line and the coupling line to cross each other vertically, are formed. A termination resistor (160) for electrically matching of connection lines is provided between the conductor terminal portion (224) and the ground plane (216).

The lower layer (240) of the printed circuit board is provided with input/output terminals (241, 242, and 243) of the module and a coupling terminal (244).

The circulator module illustrated in FIG. 6 is operated electrically as follows.

A high-frequency signal input through the first input/output terminal (241) provided on the lower layer (240) of the module is input to the connection terminal (214) of the upper layer (210) through side connection (251) of the board. A very small part of the input high-frequency signal is electrically coupled with the coupling conductor (170) of the coupling line (221) passing to cross above the main transmission line (215), and the coupled high-frequency signal is connected to the coupling terminal (244) through side connection (252), and is output. Meanwhile, most high-frequency signals are transmitted to the input/output connection conductor portion (211), and are transmitted to the input connection terminal (101) of the circulator. The high-frequency signal input to the circulator is rotated clockwise by Faraday rotation phenomenon and is transmitted to the output connection terminal (102). The transmitted high-frequency signal is connected to the output connection conductor (212), passes through side connection (253), and is output through the second input/output terminal (242) formed on the lower layer (240) of the board.

Meanwhile, the high-frequency signal input through the second input/output terminal (242) is also rotated clockwise by Faraday rotation phenomenon of the circulator, and is transmitted to the third input/output terminal (243), and the high-frequency signal is not transmitted to the first input/output terminal (241) and the coupling terminal (244).

Figure 7:
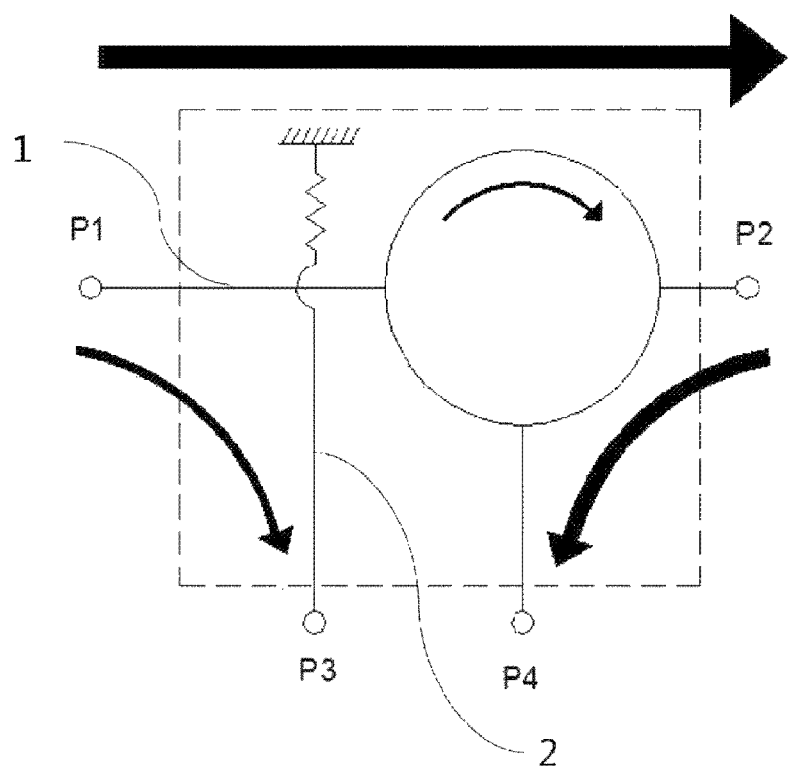
FIG. 7 is a circuit diagram illustrating a circulator module according to an embodiment of the present invention.

FIG. 7 is a circuit diagram illustrating a circulator module according to an embodiment of the present invention.

As illustrated in FIG. 7, a high-frequency signal input to a port 1 (P1) is transmitted to the circulator (100) through a main transmission line (1) (corresponding to the main transmission line (115) illustrated in FIG. 5 and FIG. 6). Herein, a coupling line (2) (corresponding to the coupling line (132) illustrated in FIG. 5 and FIG. 6) vertically crossing the main transmission line (1) samples a very small high-frequency signal, and transmits the sampled signal to a port 3 (P3).

Most high-frequency signals transmitted to the circulator (100) are rotated clockwise and are transmitted to a port 2 (P2). Meanwhile, the high-frequency signal input to the port 2 (P2) is rotated in the circulator (100), and is transmitted to a port 4 (P4). In other words, the signal input to the port 2 (P2) is transmitted to the port 4 (P4), but is not transmitted to the port 3 (P3). Accordingly, since a sampling signal extracted from the port 3 (P3) is only the high-frequency signal input from the port 1 (P1), the signal has directivity higher than that of the high-frequency signal coupled and transmitted from the port 2 (P2) to the port 3 (P3).

As a result, it is possible to obtain high directivity for the signal transmitted from the port 1 (P1), at the port 3 (P3), as much as the circulator (100) illustrated in FIG. 7 blocks a signal transmitted from the port 2 (P2) to the port 1 (P1).

Figure 8:
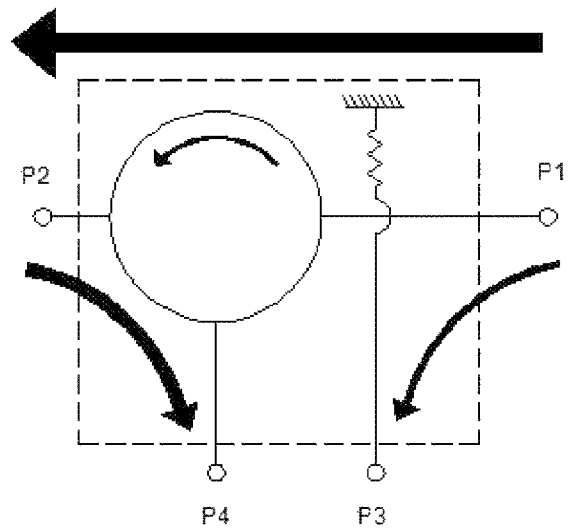
FIG. 8 is a circuit diagram illustrating a module in which a signal rotation direction of a circulator is opposite, in the circulator module illustrated in FIG. 7.

FIG. 8 is a circuit diagram illustrating a module in which a signal rotation direction of a circulator is opposite, in the circulator module illustrated in FIG. 7.

Figure 9:
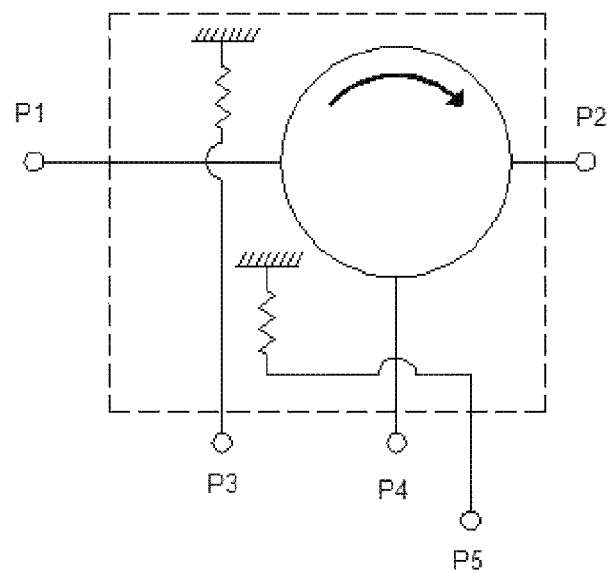
FIG. 9 is a circuit direction illustrating a circulator module according to another embodiment of the present invention.

FIG. 9 is a circuit diagram illustrating a circulator module according to another embodiment of the present invention.

As illustrated in FIG. 9, a high-frequency signal input to a port P1 (P1) is coupled at a port 3 (P3), and a high-frequency signal input to a port 2 (P2) is coupled at a port 5 (P5).

In the embodiments of the present invention, the coupling line and the main transmission line cross each other substantially vertically at a predetermined interval. The substantially vertically crossing may mean an accurately vertically crossing structure and crossing at an angle deviating by a predetermined angle from 90°. In order not to have directivity like the directional coupler according to the related art, the maximum extension width of the crossing area according to the embodiments of the present invention may be considerably shorter than ¼ of a wavelength of a frequency of an input signal.

The circulator module described according to the embodiments of the present invention may be referred to as 'directional module', 'directional circulator module', or 'directional circulator coupling module'.

The present invention is not limited to the embodiments described above. For example, the printed circuit board used in the embodiments may be replaced by a 3-dimensional shaped plastic injection-molded product provided with a conductor portion, and the circulator mounted on the printed circuit board may be formed directly on the printed circuit board. In addition, the circulator module may be embodied even by a waveguide.

While the present invention has been described with respect to the specific embodiments, it will be apparent to those skilled in the art that various changes and modifications may be made without departing from the spirit and scope of the present invention as defined in the following claims.

The invention claimed is:

1. A circulator module having directional coupler functionality comprising
   a coupling line crossing a main transmission line which passes a signal from an input port and to an output port of a circulator,
   wherein the coupling line crossing the main transmission line functions as a directional coupler, which does not have directivity by itself and directivity thereof is controlled by isolation characteristics of the circulator, and
   the coupling line crosses the main transmission line to be separated at a predetermined interval at the portion of the coupling line crossing the main transmission line.

2. The circulator module according to claim 1,
   wherein an attenuation ratio of a signal transmitted to the coupling line to an input signal input through the input port is determined by at least one of
   a distance between the main transmission line and the coupling line, or
   a line width and a length of the coupling line.

3. The circulator module according to claim 1,
   wherein the coupling line and the main transmission line are insulated from each other at the predetermined interval, and cross each other at right angles.

4. The circulator module according to claim 1,
   wherein the coupling line and the main transmission line are isolated from each other at a predetermined interval and cross each other vertically, a part of the coupling line and the main transmission line are positioned on the same layer of a printed circuit board, the other part of the coupling line is a coupling conductor having a jump line form above the main transmission line in the crossing area, and electrical coupling is generated between the main transmission line and the coupling line through the coupling conductor.

5. A circulator module comprising a function of a directional coupler which is embodied by a coupling line formed in a form of crossing a main transmission line on which a signal passing through an input port and an output port of the circulator flows, wherein the directional coupler does not have directivity by itself and directivity thereof is controlled by isolation characteristics of the circulator, and
   the coupling line crosses the main transmission line to be separated at a predetermined interval at the portion crossing the main transmission line,
   wherein the coupling line and the main transmission line are formed on layers of a printed circuit board different from each other, the printed circuit board includes a ground plane provided between the main transmission line and the coupling line, the ground plane is provided with an open slot, and a degree of electrical coupling between the main transmission line and the coupling line is controlled by the open slot.

6. A directional circulator coupling module, comprising:
   a main transmission line for passing a signal from an input port (P1) to an output port (P2);
   a coupling line jump-crossing the main transmission line at substantially a right angle and at a predetermined interval, and
   the coupling line taking a sample of the signal passing on the main transmission line and transmitting the sample to a sampling port (P4);
   a circulator for rotating the signal passed to the output port (P2) to a rotated port (P3) with the circulator acting as an isolator in blocking the signal passed to the output port (P2) from being transmitted to the input port (P1); and
   directivity of the sample transmitted to the sampling port (P4) being higher than directivity of the signal passed to the rotated port (P3).

* * * * *